United States Patent [19]
Mimoto

[11] Patent Number: 4,677,313
[45] Date of Patent: Jun. 30, 1987

[54] LSI HIGH-VOLTAGE TIMING CIRCUIT FOR MOS DYNAMIC MEMORY ELEMENT

[75] Inventor: Toshio Mimoto, Nara, Japan

[73] Assignee: Sharp Kabushiki Kaisha, Osaka, Japan

[21] Appl. No.: 707,236

[22] Filed: Mar. 1, 1985

[30] Foreign Application Priority Data

Mar. 21, 1984 [JP] Japan .................................. 59-54778

[51] Int. Cl.$^4$ ..................... H03K 4/58; H03K 17/687; H03K 17/10; G11C 11/40
[52] U.S. Cl. .................................. 307/270; 307/269; 307/482; 307/578; 307/443; 307/264; 365/104; 365/203
[58] Field of Search ............... 307/443, 452, 453, 481, 307/482, 578, 584, 582, 269, 270, 264; 365/203, 104

[56] References Cited

U.S. PATENT DOCUMENTS

| | | | |
|---|---|---|---|
| 4,371,795 | 2/1983 | Mulder et al. | 307/453 X |
| 4,390,797 | 6/1983 | Ishimoto | 307/482 X |
| 4,395,644 | 7/1983 | Misaizu | 307/482 X |
| 4,521,701 | 6/1985 | Reddy | 307/578 X |
| 4,542,307 | 9/1985 | Ikeda | 307/482 |
| 4,574,203 | 3/1986 | Baba | 307/482 X |
| 4,587,446 | 5/1986 | Okumura | 307/453 X |
| 4,587,447 | 5/1986 | Baehring | 307/482 |

OTHER PUBLICATIONS

Joynson et al., "Eliminating Threshold Losses in MOS Circuits by Bootstrapping Using Varactor Coupling, IEEE Journal of Solid State Circuits", vol. SC-7, No. 3, pp. 217-224, Jun. 1972.

Primary Examiner—Stanley D. Miller
Assistant Examiner—David R. Bertelson
Attorney, Agent, or Firm—Flehr, Hohbach, Test, Albritton & Herbert

[57] ABSTRACT

A timing circuit with a high-voltage output has a one-stage structure and is designed to immediately start charging a booster capacitor with large capacitance so that its charging is completed within the precharge period and its charges are ready to be used in the subsequent active period. This reduces the delay time and the number of circuit elements. Thus, the circuits of this invention are adapted for large scale integration and may be combined to form a data output circuit.

16 Claims, 8 Drawing Figures

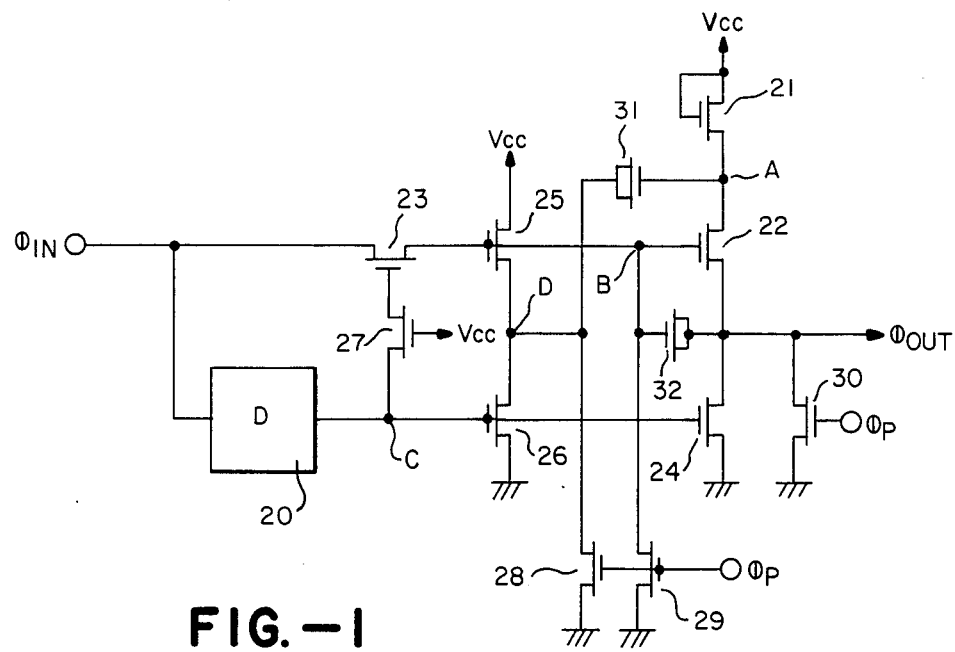
FIG.—1
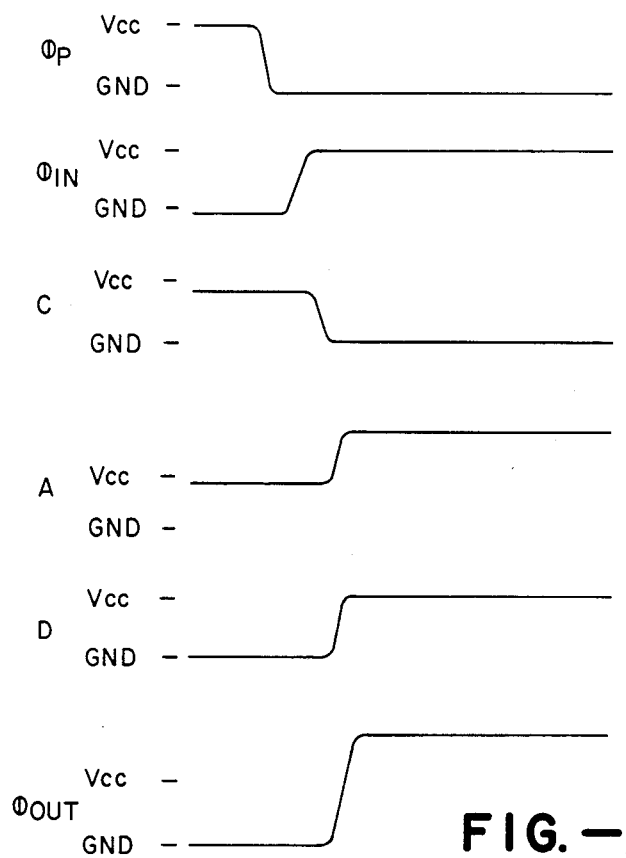
FIG.—2

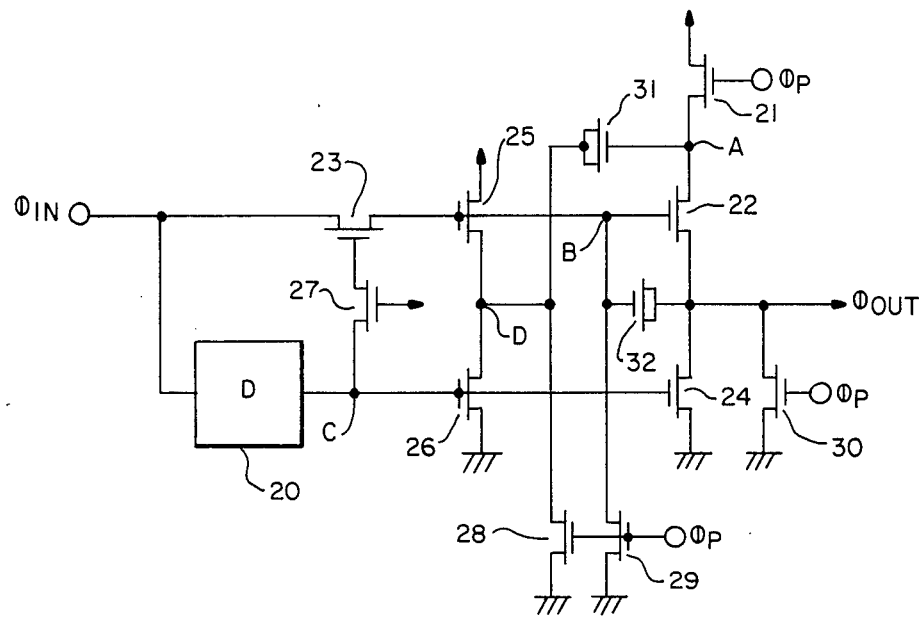
FIG. — 3
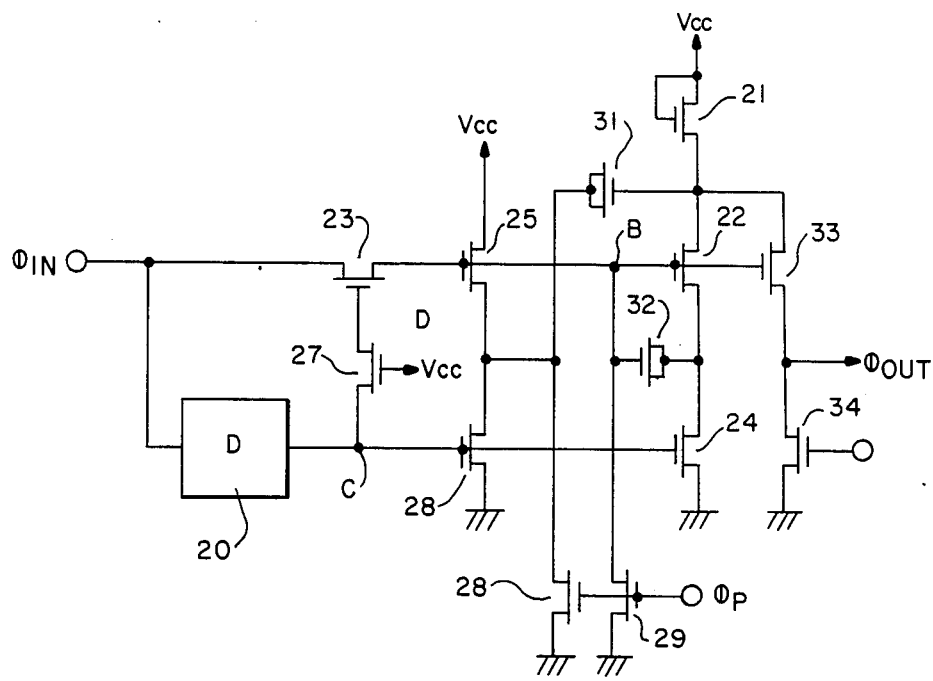
FIG. — 4

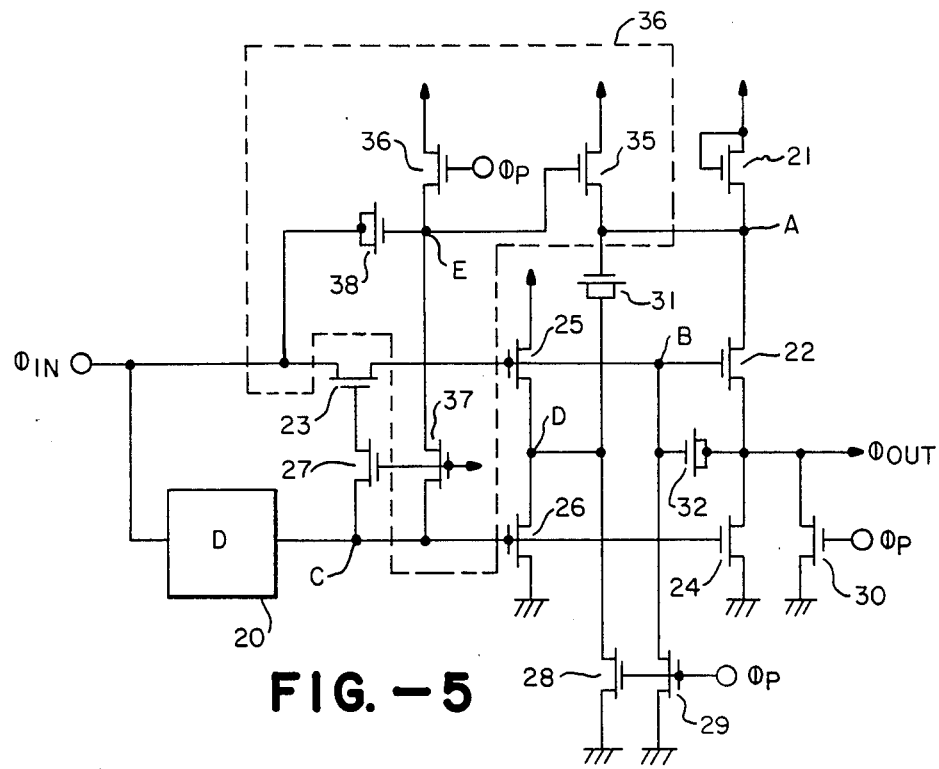
FIG. —5
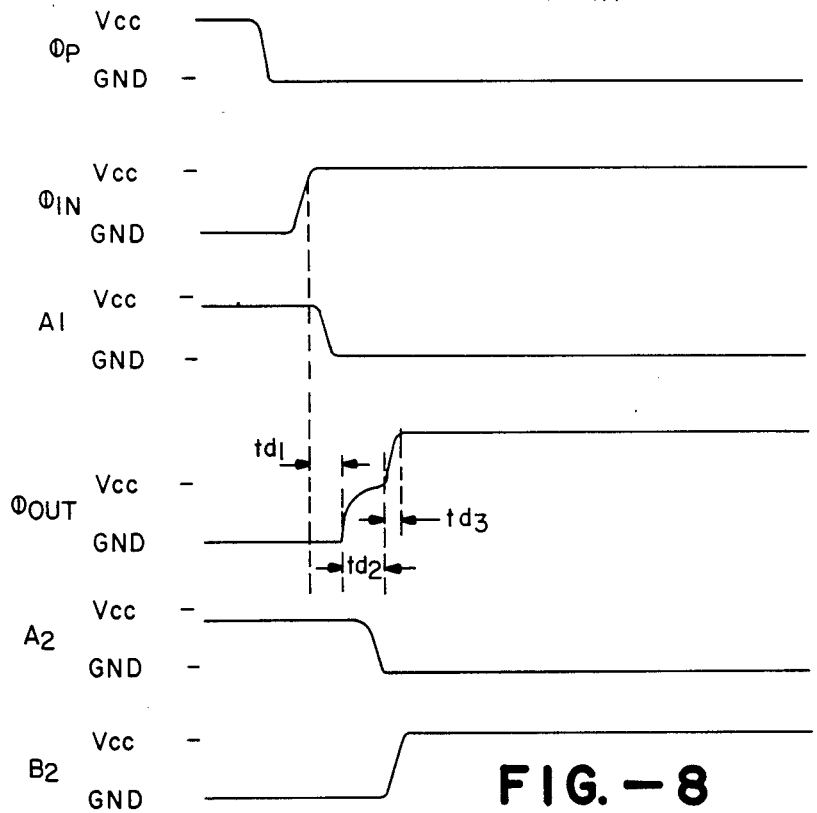
FIG. —8

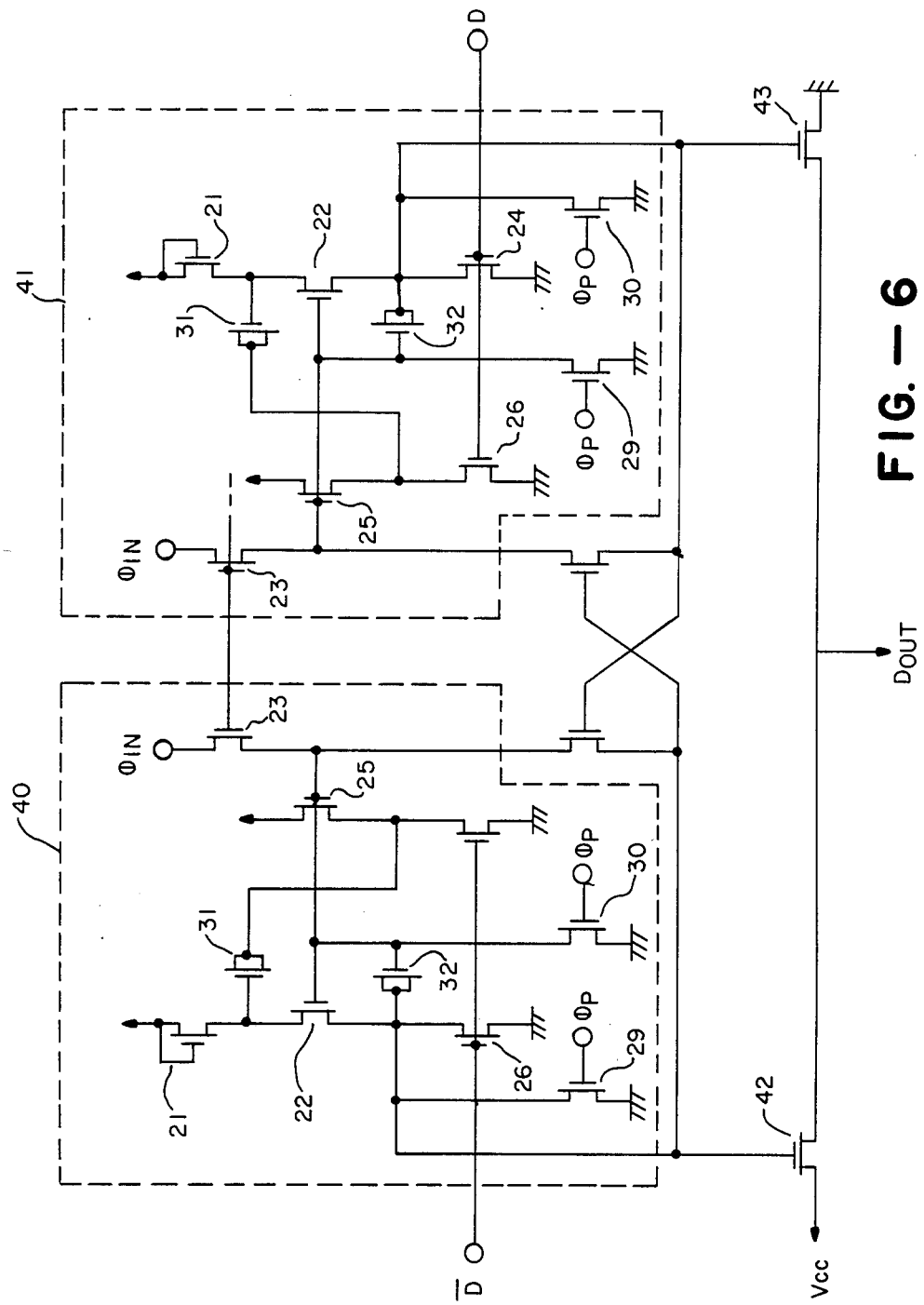
FIG.—6

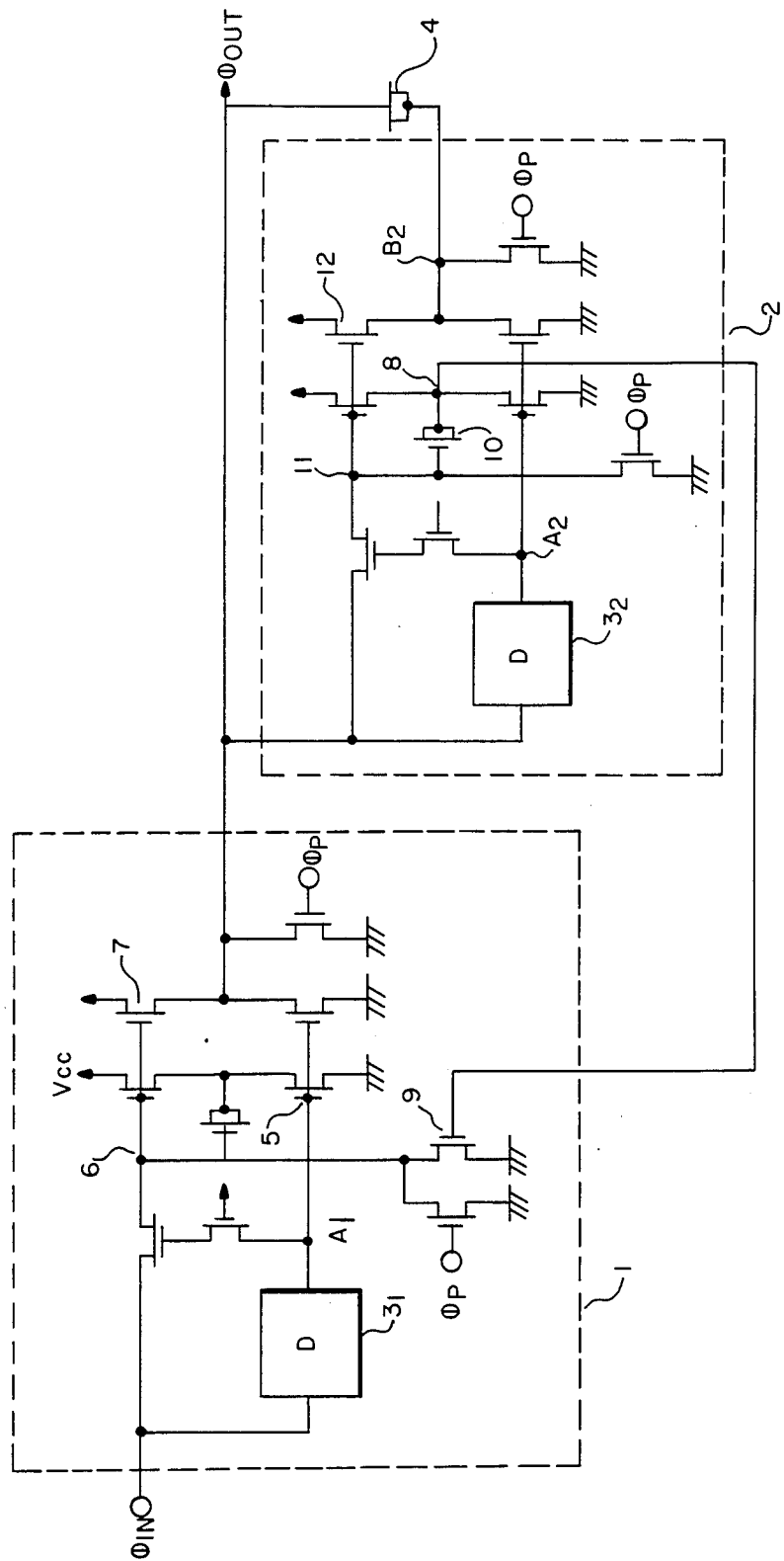
FIG.—7

4,677,313

LSI HIGH-VOLTAGE TIMING CIRCUIT FOR MOS DYNAMIC MEMORY ELEMENT

BACKGROUND OF THE INVENTION

This invention relates generally to an improved high-voltage timing circuit for a MOS dynamic memory element.

There have been attempts to improve the characteristics of high-density dynamics memory elements such as action margin by using word line drive signals with voltage level higher than the source voltage. In conventional circuits, however, the delay time becomes too long if an attempt is made to obtain such a high voltage, and this has been one of the difficulties which prevented the elements from acquiring improved speeds.

FIG. 7 shows a conventional circuit which has been in general use for dynamic memory elements and its timing diagram is shown in FIG. 8. In FIG. 7, Nos. 1 and 2 each represent an ordinary timing circuit. The output voltage from each stage is equal to the source voltage $V_{CC}$. Nos. 31 and 32 are circuits for generating active low delay signals, each determining the delay time between input and output signals for the circuit. The conventional method to construct a timing circuit with a high-voltage output by using such conventional circuits was to link the ordinary timing circuits 1 and 2 in series as shown in FIG. 7 and to make use of a MOS capacitor 4.

When this circuit generates a high-voltage output signal, the precharge signal $\phi_P$ becomes high during a precharge period as shown in FIG. 8 while the output $\phi_{OUT}$ and node $B_2$ are precharged to the ground potential level and nodes $A_1$ and $A_2$ to high levels. The input $\phi_{IN}$ remains at the ground level during this precharge period. When the precharge signal $\phi_P$ drops to the ground level and the input signal $\phi_{IN}$ is inputted during the sebsequent active period, the MOS capacitor of the first-stage timing circuit begins to be charged and when its charging has been sufficiently completed, the delay circuit output $A_1$ drops and the boost node 6 is boosted beyond $V_{CC}$, causing the output signal $\phi_{OUT}$ to start rising through a MOS field-effect transistor (hereinafter called MOST) 7. Let the time of delay in this period be denoted by td1. The MOS capacitor 4 for boosting the output signal begins to charge as the output signal $\phi_{OUT}$ rises. Let td2 be the time it takes to charge it approximately to the level of $V_{CC}$. Since the MOS capacitor 4 generally has a large capacitance, the aforementioned charging time td2 has a large value. When the charging of the MOS capacitor 4 has been completed, node $A_2$ begins to drop; the node 8 in the second-stage timing circuit reaches a high level; the MOST 9 becomes conductive; the node 6 in the first-stage timing circuit is discharged to the grund level; the MOST 7 is cut off; the node 11 is boosted higher than $V_{CC}$ by the MOS capacitor 10; $B_2$ rises through the MOST 12; and the output signal $\phi_{OUT}$ connected through the MOS capacitor 4 is boosted higher than the source voltage. Let td3 be the delay time of this period.

In summary, it requires a time period of td1+td2+td3 from the input of signal $\phi_{IN}$ until the desired high output voltage $\phi_{OUT}$ is obtained. In general, however, this required time is unnecessarily long, having a detrimental effect on the access time.

In other words, since two stages of a timing circuit are connected in series according to the conventional method, the time of delay becomes more than twice as long as if a single-stage timing circuit is used. Moreover, the boost capacitor 4 with large capacitance must be charged to a substantial degree during the active period and the time required for this charging has a limiting effect on the operating speed of the timing circuit.

SUMMARY OF THE INVENTION

It is therefore an object ot this invention to totally eliminate the shortcomings of the aforementioned conventional circuit by providing a large scale integrated circuit capable of producing a high-voltage output with a single-stage timing circuit so that, for example, the speed of dynamic memory elements can be improved.

BRIEF DESCRIPTION OF THE DRAWINGS

FIG. 1 is a circuit diagram according to the present invention.

FIG. 2 is a timing diagram of the circuit of FIG. 1.

FIGS. 3–5 are other circuit diagrams according to the present invention.

FIG. 6 is a circuit diagram of a dynamic memory embodying the present invention.

FIG. 7 is a conventional high-voltage timing circuit diagram.

FIG. 8 is a timing diagram of the conventional circuit of FIG. 7.

DETAILED DESCRIPTION OF THE INVENTION

In FIG. 1 which shows a circuit diagram according to the present invention, a source voltage $V_{CC}$ is shown inputted both to the drain and gate of a first MOST 21 of which the source is connected to the drain of a second MOST 22, the junction therebetween being node A. The source of the second MOST 22 is connected to the drain of a fourth MOST 24 of which the source is grounded. The gate of the second MOST 22 (node B) is connected to the source of a third MOST 23 and the gate of a fifth MOST 25. The drain of the fifth MOST 25 is connected to the power source $V_{CC}$ and its source to the drain of a sixth MOST 26. Inputted to the gates of the sixth MOST and the fourth MOST 24 is the output signal of a delay circuit 20 which is adapted to output an input signal $\phi_{IN}$ with a delay by a predetermined time. The input signal $\phi_{IN}$ is inputted not only to the delay circuit 20 but also to the drain of the third MOST 23. Connected between the gate of the third MOST 23 and the output terminal of the delay circuit 20 (node C) is a seventh MOST 27, to the gate of which the source voltage $V_{CC}$ is applied.

There is a first booster capacitor 31 comprising a MOS transistor between a junction node D of the fifth MOST 25 and the sixth MOST 26 and the aforementioned node A. There is similarly a second booster capacitor 32 connected between the gate of the second MOST 22 (node B) and the source thereof. An eighth MOST 28 is connected between the aforementioned node D and the ground and a ninth MOST 29 is similarly connected between the node B and the ground while a precharge signal $\phi_P$ is inputted to the gates of both these MOSTs 28 and 29. An output signal $\phi_{OUT}$ of this timing circuit is derived from the source terminal of the second MOST 22. A tenth MOST 30, to the gate of which the precharge signal $\phi_P$ is inputted, is connected between this output terminal and the ground.

During the precharge period in this timing circuit, the precharge signal $\phi_P$ is high so that the MOSTs 30, 29 and 28 are conductive, and the output signal $\phi_{OUT}$, node B and node D are at the ground level while node C is precharged at a high level; MOSTs 25 and 22 are cut off. The first booster MOS capacitor 31 is precharged during this period through the first MOST 21. This precharge potential is $V_{CC}-V_{TH}$ where $V_{TH}$ is the threshold potential of the first MOST 21.

When the circuit enters an active period as shown in FIG. 2 and the precharge signal $\phi_P$ drops to the ground level while an input signal $\phi_{IN}$ of the power source level ($V_{CC}$) is inputted, charging of the second MOS capacitor 32 is started through the third MOST 23. Node D and the output $\phi_{OUT}$ remain low because node C remains high due to the delay circuit 20 until the second MOS capacitor 32 becomes sufficiently charged.

When the second MOS capacitor 32 is completely charged, the output of the delay circuit 20 drops and the sixth MOST 26 and the fourth MOST 24 become cut off. This causes node D to start rising to the level of $V_{CC}$ and the potential of node A capacitively connected by the first booster MOS capacitor 31 is boosted in synchronism with the rise at node D from $(V_{CC}-V_{TH})$ to $(2V_{CC}-V_{TH})$ if there is no load. The charge at node A raises the output signal $\phi_{OUT}$ through the second MOST 22 while the second capacitor 32 boosts the gate node B of the second MOST 22 so that a signal higher than the source voltage is output in the end. Its maximum value will be $(2V_{CC}-V_{TH})$ when the load of $\phi_{OUT}$ is 0. Because the aforementioned series of actions takes place instantly as soon as the node D begins to rise, this circuit functions as a very fast high-voltage output timing circuit.

One of the significant characteristics of this embodiment is that the charging of the first MOST capacitor 31 with large capacitors is completed within the precharge period so that its charges can be utilized immediately in the subsequent active period. Another characteristic is that this circuit contains only one delay circuit, being a timing circuit of a single-stage structure, so that the delay between the input and output signals $\phi_{IN}$ and $\phi_{OUT}$ can be reduced to less than one-half of that by a conventional circuit. Furthermore, the required number of circuit elements can also be reduced to about one-half so that this circuit can contribute significantly to large scale integration of elements.

FIG. 3 is a variation of the circuit of FIG. 1 wherein the precharge signal $\phi_P$ is inputted to the gate of the first MOST 21. The timing diagram for the circuit is the same as that for FIG. 1.

FIG. 4 is a second variation wherein an eleventh MOST 33 and a twelfth MOST 34 are added between the node A of the embodiment of FIG. 1 and the ground so that the gates of the eleventh MOST 33 and the second MOST 22 are connected together and that the precharge signal $\phi_P$ is inputted to the gate of the twelfth MOST 34. In this embodiment, the output signal $\phi_{OUT}$ is taken out from the source of the eleventh MOST 33. This circuit is effective when the output load is relatively large. Although the number of elements is greater than in the circuit of FIG. 1, power consumption can be reduced by this circuit for the following reason.

According to the embodiment of FIG. 1, the MOSTs 22 and 24 are both conductive while the second MOS capacitor 32 is being charged so that a large current can flow through them. In the circuit of FIG. 4, by contrast, the second MOST 22 and the eleventh MOST 33 take the place of the second MOST 22 of FIG. 1 and a current flows only through the second MOST 22. Since the twelfth MOST 34 is cut off during the active period, the current through the eleventh MOST 33 flows only to the output side and not to the ground. This is the reason for reduction of power consumption by the circuit of FIG. 4.

FIG. 5 is a third variation of the circuit of FIG. 1 wherein three additional MOSTs 35, 36 and 37 as well as a third MOS capacitor 38 are added to the circuit of FIG. 1. The MOST 35 is connected between the power source $V_{CC}$ and the node A while the MOSTs 36 and 37 are added between the power source $V_{CC}$ and the node C so that the gate of the MOST 35 is connected to node E which is the junction between the MOSTs 36 and 37. The precharge $\phi_P$ is inputted to the gate of the MOST 36 while the power source voltage $V_{CC}$ is applied to the gate of the MOST 37. The MOS capacitor 38 is connected between the node E and the input terminal.

The broken line in FIG. 5 indicates the elements which are provided in addition to those of the circuit of FIG. 1. In the circuit of FIG. 1, the MOSTs 21, 22 and 24 become conductive while the MOS capacitor 32 is being charged so that the voltage at node A drops somewhat and the charge on the MOS capacitor 31 is reduced. The purpose of adding these elements inside the broken line of FIG. 5 is to maintain the potential at node A only during the period in which the MOS capacitor is being charged.

When the input signal $\phi_{IN}$ is inputted as shown in FIG. 1, the gate of the MOST 35 is boosted beyond the level of $V_{CC}$ by the MOS capacitor 38 and current flows into the node A through the MOST 35, making up for the aforementioned potential drop at point A. This action continues until the MOS capacitor 32 becomes sufficiently charged. The node E is discharged through the MOST 37 when the voltage drops at node C and the MOST 35 is cut off.

Although the activating signal $\phi_{IN}$ was inputted into the drain of the third MOST 23 in all examples discussed abouve, it may be inputted instead into the gate of the third MOST 23 by connecting its drain to the source $V_{CC}$ and eliminating the MOST 27.

FIG. 6 shows the present invention being applied to a data output circuit wherein Nos. 40 and 41 are examples of circuit embodying the present invention. D and $\overline{D}$ are data input signals and only one of them drops to the ground potential level during an active period when a suitable time of delay has elapsed after the input signal $\phi_{IN}$ is inputted. Nos. 42 and 43 are output buffer MOSTs connected to the output end. Since a voltage higher than $V_{CC}$ results at the gate of either of these MOSTs as explained above, depending on the polarity of D or $\overline{D}$, a very fast output circuit can be realized.

The examples described above may be used in any other combinations. They may also be combined with a conventional MOST circuit. In summary, the present invention teaches how a high-voltage timing circuit can be constructed with a small number of elements and further how to reduce the time from the input of a signal until an output signal is taken out. Such circuits are applicable to all types of MOS transistor integrated circuits to produce circuits adapted for high-speed processing.

What is claimed is:
1. An LSI timing circuit comprising
 a first MOS field-effect transistor (MOST) operating to supply a charging current at least during a precharge period;

a second MOST, the drain thereof being connected to the source of said first MOST;

a third MOST, the source thereof being connected to the gate of said second MOST;

a fourth MOST, the drain thereof being connected to the source of said second MOST, the source thereof being connected to the ground potential, and the gate thereof being connected to a signal output delayed from an activating signal;

a fifth MOST, the drain thereof being connected to a power source and the gate thereof being connected to the source of said third MOST;

a sixth MOST, the drain thereof being connected to the source of said fifth MOST, the gate thereof being connected to said signal output, and the source thereof being connected to the ground potential;

a first booster capacitor connected between said first MOST and said sixth MOST;

a second booster capacitor connected between the gate and the source of said second MOST; and an output terminal for an output signal connected to the source of said second MOST;

said activating signal being applied to the drain or the gate of said third MOST.

2. The timing circuit of claim 1 further comprising one or more additional MOSTs individually between the source of said second MOST and the ground potential, between the source of said fifth MOST and the ground potential and/or between the gate of said second MOST and the ground potential, a precharge signal being received at the gate of each of said one or more additional MOSTs.

3. The timing circuit of claim 1 wherein a precharge signal is received at to the gate of said first MOST.

4. The timing circuit of claim 2 wherein said precharge signal is received at the gate of said first MOST.

5. An LSI timing circuit comprising a first MOS field-effect transistor (MOST) operating to supply a charging current at least during a precharge period;

a second MOST, the drain thereof being connected to the source of said first MOST;

a third MOST, the source thereof being connected to the gate of said second MOST;

a fourth MOST, the drain thereof being connected to the source of said second MOST, the source thereof being connected to the ground potential, and the gate thereof being connected to a signal output delayed from an activating signal, said activating signal being applied to the drain or the gate of said third MOST;

a fifth MOST, the drain thereof being connected to a power source and the gate thereof being connected to the source of said third MOST;

a sixth MOST, the drain thereof being connected to the source of said fifth MOST, the gate thereof being connected to said signal output, and the source thereof being connected to the ground potential;

a first booster capacitor connected between said first MOST and said sixth MOST;

a second booster capacitor connected between the gate and the source of said second MOST;

a seventh MOST, the drain thereof being connected to the source of said first MOST, and the gate thereof being connected to the gate of said second MOST;

an eighth MOST, the drain thereof being connected to the source of said seventh MOST, said precharge signal being received at the gate thereof, and the source thereof being connected to the ground potential; and an output terminal for deriving an output signal connected to the source of said seventh MOST.

6. The timing circuit of claim 1 further comprising a seventh MOST, the source thereof being connected to the source of said first MOST and the drain thereof being connected to said power source, said activating signal being inputted through the gate of said seventh MOST, said circuit being characterized as generating a potential higher than said power source during a period until said signal output makes a change.

7. The timing circuit of claim 2 further comprising a seventh MOST, the source thereof being connected to the source of said first MOST and the drain thereof being connected to said power source, said activating signal being inputted through the gate of said seventh MOST, said circuit being characterized as generating a potential higher than said power source during a period until said signal output makes a change.

8. The timing circuit of claim 3 further comprising a seventh MOST, the source thereof being connected to the source of said first MOST and the drain thereof being connected to said power source, said activating signal being inputted through the gate of said seventh MOST, said circuit being characterized as generating a potential higher than said power source during a period until said signal ouput makes a change.

9. The timing circuit of claim 4 further comprising a seventh MOST, the source thereof being connected to the source of said first MOST and the drain thereof being connected to said power source, said activating signal being inputted through the gate of said seventh MOST, said circuit being characterized as generating a potential higher than siad power source during a period until said signal output makes a change.

10. The timing circuit of claim 5 further comprising a ninth MOST, the source thereof being connected to the source of said first MOST and the drain thereof being conected to said power source, said activating signal being inputted through the gate of said ninth MOST, said circuit being characterized as generating a potential higher than said power source during a period until said signal output makes a change.

11. The timing circuit of claim 5 further comprising one or more additional MOSTs individually between the source of said second MOST and the ground potential, between the source of said fifth MOST and the ground potential and/or between the gate of said second MOST and the grund potential, said precharge signal being received at the gate of each of said one or more additional MOSTs.

12. The timing circuit of claim 5 wherein said precharge signal is received at the gate of said first MOST.

13. The timing circuit of claim 11 further comprising a ninth MOST, the source thereof being connected to the source of said first MOST and the drain thereof being connected to said power source, said activating signal being inputted through the gate of said ninth MOST, said circuit being characterized as generating a potential higher than said power source during a period until said signal output makes a change.

14. The timing circuit of claim 12 further comprising a ninth MOST, the source thereof being connected to the source of said first MOST and the drain thereof being connected to said power source, said activating signal being inputted through the gate of said ninth MOST, said circuit being characterized as generating a potential higher than said power source during a period until said signal output makes a change.

15. The timing circuit of claim 11 wherein said precharge signal is received at the gate of said first MOST.

16. The timing circuit of claim 15 further comprising a ninth MOST, the source thereof being connected to the source of said first MOST and the drain thereof being connected to said power source, said activating signal being inputted through the gate of said ninth MOST, said circuit being characterized as generating a potential higher than said power source during a period until said signal output makes a change.

* * * * *